United States Patent [19]
Kholodenko

[11] Patent Number: 5,900,064
[45] Date of Patent: May 4, 1999

[54] PLASMA PROCESS CHAMBER

[75] Inventor: Arnold Kholodenko, San Francisco, Calif.

[73] Assignee: Applied Materials, Inc., Santa Clara, Calif.

[21] Appl. No.: 08/847,013

[22] Filed: May 1, 1997

[51] Int. Cl.[6] .................................................. C23C 16/00
[52] U.S. Cl. .................. 118/723 R; 118/723 E; 118/728; 156/345; 427/569; 438/710; 438/758
[58] Field of Search ........................... 118/723 R, 723 E, 118/723 ER, 723 I, 723 IR, 723 MW, 728, 500, 723 AN; 156/345; 427/569; 438/710, 758

[56] References Cited

U.S. PATENT DOCUMENTS

| | | | |
|---|---|---|---|
| 4,645,218 | 2/1987 | Ooshio et al. ........................... 279/1 M |
| 4,869,801 | 9/1989 | Helms et al. ............................ 204/298 |
| 5,213,658 | 5/1993 | Ishida ...................................... 156/643 |
| 5,228,501 | 7/1993 | Tepman et al. ....................... 165/80.1 |
| 5,246,532 | 9/1993 | Ishida ...................................... 156/345 |
| 5,298,465 | 3/1994 | Levy ........................................ 437/225 |
| 5,330,607 | 7/1994 | Norwicki ................................ 156/345 |
| 5,352,294 | 10/1994 | White et al. ............................. 118/725 |
| 5,423,918 | 6/1995 | Gupta et al. ................................ 134/1 |
| 5,552,124 | 9/1996 | Su ............................................. 156/345 |
| 5,556,500 | 9/1996 | Hasegawa et al. ..................... 156/345 |
| 5,578,164 | 11/1996 | Kurono et al. ....................... 156/643.1 |
| 5,643,394 | 7/1997 | Maydan et al. ........................ 156/345 |
| 5,685,914 | 11/1997 | Hill et al. ............................... 118/723 E |
| 5,746,875 | 5/1998 | Maydan et al. ........................ 156/345 |
| 5,783,492 | 7/1998 | Higuchi et al. ........................ 438/710 |

FOREIGN PATENT DOCUMENTS

639850A1  2/1995  European Pat. Off. .

Primary Examiner—Bruce Breneman
Assistant Examiner—Luz Alejandro
Attorney, Agent, or Firm—Ashok Janah

[57] ABSTRACT

A process chamber (14) for processing a substrate (12) in a plasma, comprises a support for supporting the substrate having a surface with a perimeter (32). A gas distributor is provided for distributing process gas into the chamber (14). A plasma generator (40) is used to generate a plasma comprising plasma species from the process gas. A plurality of electrical ground pathways (80) around the perimeter (32) of the substrate (12) are spaced apart, electrically isolated from one another, and provide electrical paths to ground for the charge carried by the plasma species. Preferably, the ground pathways (80) extend through a dielectric surface (70) abutting and extending substantially continuously around the perimeter (32) of the substrate (12).

33 Claims, 8 Drawing Sheets

PLASMA PROCESS CHAMBER

BACKGROUND

This invention relates to an apparatus used for plasma processing of substrates.

In semiconductor fabrication processes, an enclosed process chamber having gas distributors for distributing process gas therein, is used to deposit material upon, etch, or implant material on substrates. A plasma is formed from the process gas using plasma generators comprising inductor coils, microwave plasma generators, or capacitive coupled process electrodes. Process gas byproducts are exhausted through an exhaust system. The gas distributor, plasma generator, and exhaust system often fail to provide a uniform distribution of reactive process gas or plasma species across the substrate surface. For example, process gas distributors positioned directly above the substrate can cause an asymmetric distribution of reactive process gas species across the substrate, with higher concentrations of reactive process gas at the center of the substrate and lower concentrations at the peripheral edge. Conversely, a process gas distributor positioned around the peripheral edge of the substrate can cause the concentration of reactive process gas or plasma to be higher at the peripheral edge than the center of the substrate. The distribution of process gas or plasma species can also be adversely affected by the nature of the magnetic fields formed by the plasma generator, or the asymmetric positioning of the exhaust nozzles that exhaust spent process gas byproducts from the chamber. It is desirable for the distribution of plasma species across the surface of the substrate to be uniform from the center to the peripheral edge of the substrate.

The use of process gas containment structures, such as a focusing ring around the substrate, are known to reduce such concentration gradients of reactive process gas, by containing the flow of process gas around the substrate. Typically the focus ring comprises a wall extending upwards in a plane transverse to the surface of the substrate, to encircle the substrate and contain the flow of process gas on the substrate. However, conventional plasma focusing rings often cause process gas to stagnate at the bottom wall of the focus ring next to the peripheral edge of the substrate, leading to the deposition of gas byproduct deposits on the focus ring. Such particulate contamination of the substrate can be reduced by periodically cleaning the process chamber components using a plasma of a corrosive gas, such as $NF_3$. However, the corrosive plasmas erode the processing components and reduce the lifetime of the process chamber. Also, the cleaning process step increases down time of the apparatus and reduces process efficiency. Thus it is desirable to have a process gas distribution and containment system that reduces formation and deposition of contaminants on the substrate.

Additional non-uniformity problems arise in capacitively coupled chambers, where an electrically biased cathode electrode is located below a substrate, and the anode electrode is formed by electrically grounding the walls of the process chamber. The anode and cathode are maintained at differing electrical potentials to form an electric field that generates and/or accelerates plasma ions from the process gas toward the substrate. A strong and uniformly distributed electric field in the process chamber is needed to generate a uniform distribution of plasma ions for processing the substrate. However, conventional chambers often have a low surface area ratio of anode to cathode which results in a low density of plasma ions that does not allow efficient processing of the substrate. The substrate must remain in the process chamber for an extended period to provide sufficient exposure to the plasma ions, increasing process cycle time, and reducing process throughput. A low anode to cathode surface area ratio can also form a non-uniform distribution of electric field lines across the width of the chamber resulting in non-uniform processing of the substrate. The low surface area ratio is a particular problem when the anode or cathode surfaces are distant or removed from the substrate, for example, in process chambers in which the anode is formed by grounding the sidewalls, bottom wall, and/or ceiling of the process chamber.

Yet another problem arises when electrostatic chucks are used to electrostatically hold the substrate during processing. Electrostatic chucks comprise an electrostatic member electrically biased with respect to the substrate by an electrical voltage causing electrostatic charge to accumulate therein. In monopolar chucks, the plasma provides electrically charged species having opposing polarity to the substrate resulting in an attractive electrostatic force that holds the substrate to the chuck. Sufficient plasma ions are needed to accumulate electrically charged species in the substrate. A low anode to cathode surface area generates a low density level of plasma ions that result in insufficient charge accumulation and resultant weak electrostatic attractive forces that can cause the substrate to become misaligned during processing, resulting in loss of the entire substrate.

In electrostatic chucking systems, additional problems arise during dechucking or release of substrate from the electrostatic chuck. To dechuck a substrate, the residual electrostatic charge remaining after the supply of voltage to the electrostatic chuck is discontinued needs to dissipated to ground. In one method, the charge accumulated in the substrate is removed by bringing a grounded conductor in contact with the substrate. However, such discharging methods do not remove the charge carried by the plasma ions above the substrate. Charge from the charged plasma ions continues to accumulate on the substrate causing the substrate to remain electrostatically attracted to the chuck even after power to the chuck is turned off. During removal from the chuck, the substrate can become damaged due to opposing forces applied to the substrate by residual electrostatic attraction and by the substrate removal apparatus, such as lift pins. Alternatively, the substrate dechucking time must be increased to allow dissipation of the charge carried by the plasma ions by slow diffusional transport and leakage to ground through the process chamber walls, before attempts are made to remove the substrate.

Thus, there is a need for a plasma processing apparatus capable of maintaining a substantially uniform concentration of reactive gas across the substrate surface, and for reducing deposition of contaminants and process gas byproducts on the substrate. There is a further need for a plasma processing apparatus capable of providing a high anode to cathode surface area ratio for generating a high density of plasma ions. There is also a need for an apparatus that provides sufficient accumulation of charge on the substrate to securely hold the substrate on the electrostatic chuck, and is capable of rapidly discharging the plasma ions to allow fast dechucking of the substrate.

SUMMARY

The present invention provides a plasma processing apparatus that generates a uniform plasma distribution in the chamber. The apparatus also directs the flow of process gas toward the substrate and exhausts spent process gas byproducts to obtain a more uniform distribution of process gas reactant species across the substrate surface.

In one embodiment, the present invention comprises a plasma process chamber for processing a substrate having a surface with a perimeter. The process chamber comprises a support for supporting the substrate, and a gas distributor for distributing process gas into the process chamber. A plasma generator forms plasma comprising charged plasma species from the process gas. A plurality of electrical ground pathways around the perimeter of the substrate, are spaced apart and electrically isolated from one another, to provide paths to electrical ground for the charged plasma species in the chamber. The ground pathways provide a high anode to cathode surface area ratio to generate a uniform plasma density, and also provide rapid dissipation of charge from around the substrate to provide fast dechucking of electrostatically held substrates.

In another aspect, the present invention comprises a plasma process chamber having a gas distributor for distributing process gas in the chamber, and one or more exhaust ports for removing spent process gas from the chamber. A plasma generator forms a plasma from the process gas. A focus ring comprises a wall surrounding the substrate to direct the plasma toward the substrate surface. The wall of the focus ring comprises an open-ended channel including an inlet adjacent to, and extending substantially continuously around, the peripheral edge of the substrate, and an outlet directed substantially towards, and leading to, the exhaust ports in the chamber. The open-ended channel removes process gas byproducts from around the peripheral edge of the substrate.

In yet another aspect, the present invention comprises a composite focus ring having a conductor member shaped and sized to abut, and extend continuously around, a perimeter of the substrate. A dielectric on the conductor member comprises a plurality of electrical ground pathways extending therethrough, the ground pathways capable of discharging charge carried by plasma species used to process the substrate. The composite focus ring provides more uniform plasma distribution, as well as providing rapid dissipation of charge carried by plasma species above the substrate.

In still another aspect, the present invention provides a method of processing a substrate in a plasma zone. The method comprises the steps of:

(a) placing a substrate in the plasma zone, the substrate having a surface with a perimeter;

(b) introducing process gas into the plasma zone and forming charged plasma species from the process gas; and (c) maintaining a plurality of electrical ground pathways around the perimeter of the substrate to provide electrical paths to ground for the charged plasma species, the ground pathways spaced apart and electrically isolated from one another.

DRAWINGS

These and other features, aspects, and advantages of the present invention will become better understood with regard to the following description, appended claims, and accompanying drawings which illustrate examples of the invention, where:

DESCRIPTION

The present invention provides a plasma processing apparatus useful for depositing material on the substrate, such as by chemical vapor deposition or sputtering processes; implanting material by ion implantation processes; and particularly useful for etching layers on the substrate, such as by plasma etching or reactive ion etching processes. The apparatus provides a uniform plasma distribution and process gas flow in the chamber, and reduces deposition of process gas byproducts in the process chamber. The apparatus also provides a high anode to cathode surface area ratio that generates a high plasma density, and provides rapid dissipation of charge from around the substrate to provide fast dechucking of electrostatically held substrates.

Figure 1:
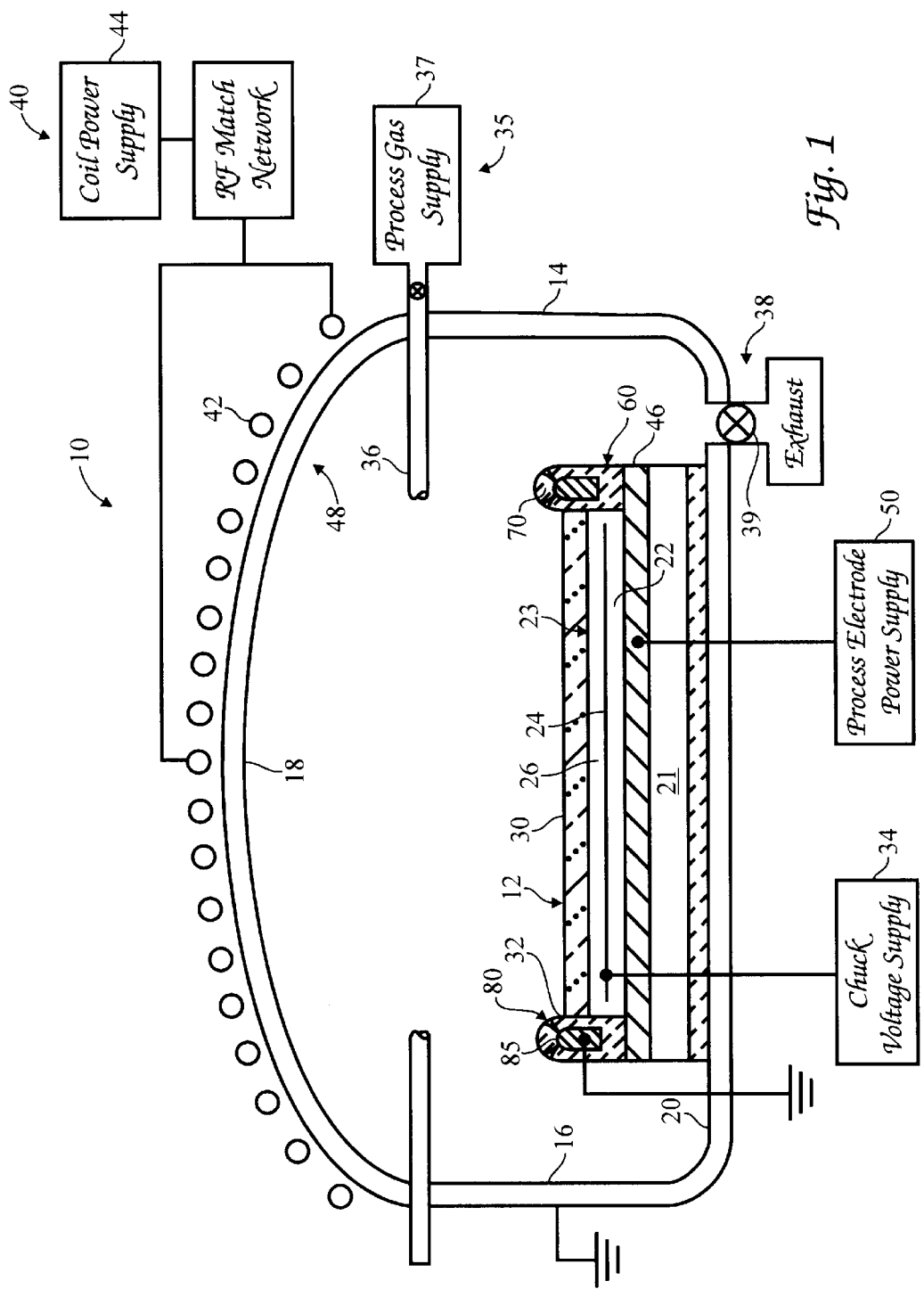
FIG. 1 is a sectional schematic view of a process chamber according to the present invention.

An exemplary plasma processing apparatus 10 of the present invention suitable for processing a semiconductor substrate 12 is illustrated in FIG. 1. The particular embodiment of the apparatus 10 shown herein is provided only to illustrate operation of the invention and should not be used to limit the scope of the invention. The apparatus 10 generally comprises an enclosed process chamber 14 having sidewalls 16, a top wall 18, and a bottom wall 20. The substrate 12 is transferred to the chamber 14 using a robotic arm (not shown) which deposits the substrate on lift pins extending through a support 21 for supporting the substrate. Preferably, the substrate 12 is deposited on an electrostatic chuck 22 having an electrostatic member 23 that is used to electrostatically hold the substrate in the chamber 14. Typically, the electrostatic member 23 comprises an electrode 24 covered by a dielectric layer 26, such as a polymer, for example polyimide, or a ceramic material such as alumina, or alumina/titania compositions. An electrostatic voltage supply 34 provides a voltage to the chuck electrode 24 to operate the chuck 22. When resting on the chuck 22, the substrate 12 has an exposed surface 30 that is processed in the chamber, and a surrounding perimeter 32 or peripheral edge. The temperature of the substrate 12 is controlled by a flow of helium gas in grooves in the surface of the chuck 22.

Process gas used to deposit material on, implant, or etch the substrate 12 is introduced into the chamber 14 through a gas distributor system 35 having gas nozzles 36 peripherally disposed about the substrate. Typically, at least four gas nozzles 36 are arranged around the circumference of the substrate 12. The chamber is maintained at a pressure ranging from about 0.1 to about 1000 mTorr, and more typically from 1 to 100 mTorr. Spent process gas and process gas byproducts are exhausted from the process chamber 14 through an exhaust system 38 capable of achieving a minimum pressure of about $10^{-3}$ mTorr in the chamber. A throttle valve 39 is provided in the exhaust 38 for controlling the pressure in the chamber 14. The various components in the process chamber 14, and the chamber itself, can be made from a variety of materials including metals, ceramics, glasses, polymers and composite materials, using conventional machining and molding methods. Preferred metals that are used to fabricate the process chamber 14 and components include aluminum, anodized aluminum, "HAYNES 242," "Al-6061," "SS 304," "SS 316," INCONEL, and ceramic oxides, nitrides, carbides, or borides.

A plasma is formed from the process gas introduced in the chamber 14 in a plasma zone using a plasma generator 40 that couples an electric field into a plasma zone of the chamber, as for example described in U.S. patent application Ser. No. 08/596,960, entitled "Plasma Process for Etching Multicomponent Alloys," filed on Feb. 5, 1996, to Ma et al., which is incorporated herein by reference. The plasma generator 40 can comprise an inductor coil 42, adjacent to the process chamber 14, that is capable of applying an inductive electric field in the plasma zone when powered by a current supplied by a coil power supply 44. Preferably, an RF current is applied to the inductor coil 42 at a source power level of preferably from about 400 Watts to about 3000 Watts. The plasma in the plasma zone can be enhanced by a magnetic field generator, such as a permanent magnet or electromagnetic coils, which are used to apply a magnetic field in the chamber to increase the density or uniformity of the plasma, as described in U.S. Pat. No. 4,842,683, issued Jun. 27, 1989, which is incorporated herein by reference. Generally, the magnetic field is less than about 500 Gauss, more typically from about 10 to about 100 Gauss, and most typically from about 10 Gauss to about 30 Gauss.

In addition to the inductor coil 42, a cathode electrode 46 and an anode electrode 48, powered by an electrode power supply 50 are used to generate a capacitively coupled electric field in the process chamber 14. In the example shown, the cathode process electrode 46 is located below the substrate 12 and the anode process electrode 48 is formed by electrically grounding the sidewalls of the process chamber 14. Typically an RF voltage at a bias power level of from about 20 to about 1000 Watts is applied to the cathode electrode 46 and the anode electrode 48 is electrically grounded. The capacitive electric field is perpendicular to the plane of the substrate 12, and accelerates the charged plasma species toward the substrate to provide more vertically oriented deposition or etching of the substrate. The frequency of the RF voltage applied to the process electrodes, and/or inductor coil 42 is typically from about 50 Khz to about 60 MHz, and more typically about 13.56 MHz.

A dielectric covered conductor member 60 effectively increases the surface area of the anode electrode 48 in the chamber 14 by providing an electrically grounded dielectric surface 70 abutting and extending continuously around the substrate 12. The extended anode 48 and the cathode 46 behave as the plates of a capacitor at differing potentials that generate an electric field between them. Increasing the surface area of the anode 48 advantageously increases the ratio of the surface area ratio of the anode 48 to the cathode 46. A higher anode to cathode surface area ratio provides an electric field that is spread across a larger volume in the process chamber 14 to form increased amounts of plasma ions from the process gas. Improved plasma generation provides an increased number of plasma ions that are available to process the exposed surface 30 of the substrate 12, allowing the substrate to receive sufficient plasma ion exposure in a short processing time. Thus, preferably, the surface area of the dielectric surface 70 and conductor member 60 is selected to provide an anode to cathode surface area ratio of at least about 1.5:1, and more preferably at least about 2:1.

The dielectric covered conducting member 30 also provides a more uniformly distributed electric field in the process chamber 14 to generate sufficient quantities of charged plasma ions to allow secure chucking of the substrate 12 to the chuck 22. When the electrostatic member 23 is electrically biased with respect to the substrate 12 by an electrical voltage, electrostatic charge accumulates in the electrostatic member. A high density of plasma ions impinging on the substrate 12 provide sufficient accumulation of electrically charged species on the substrate 12 to generate a strong attractive force that securely holds the substrate 12 to the electrostatic member 23. This prevents inadvertent movement of the substrate 12 during processing.

As shown in FIG. 1, the electrical conductor member 60 abuts and extends contiguously around the perimeter 32 of the substrate 12. The conductor member 60 is fabricated from an electrically conducting material, such as a metal, for example anodized aluminum. The conductor member 60 is electrically grounded, for example, by electrically connecting the conductor member 60 to the grounded sidewalls 16 of the process chamber 14 to maintain the conductor member at the same electrical potential as the sidewalls 16 of the process chamber. To improve electrical conductivity between the conductor member 60 and the sidewalls 16 of the process chamber 14, the conductor member can be nickel plated at its interface with the sidewalls of the process chamber. Preferably, the conductor member 60 comprises an annular collar that circumferentially surrounds the perimeter 32 of the substrate 12.

Figure 2:
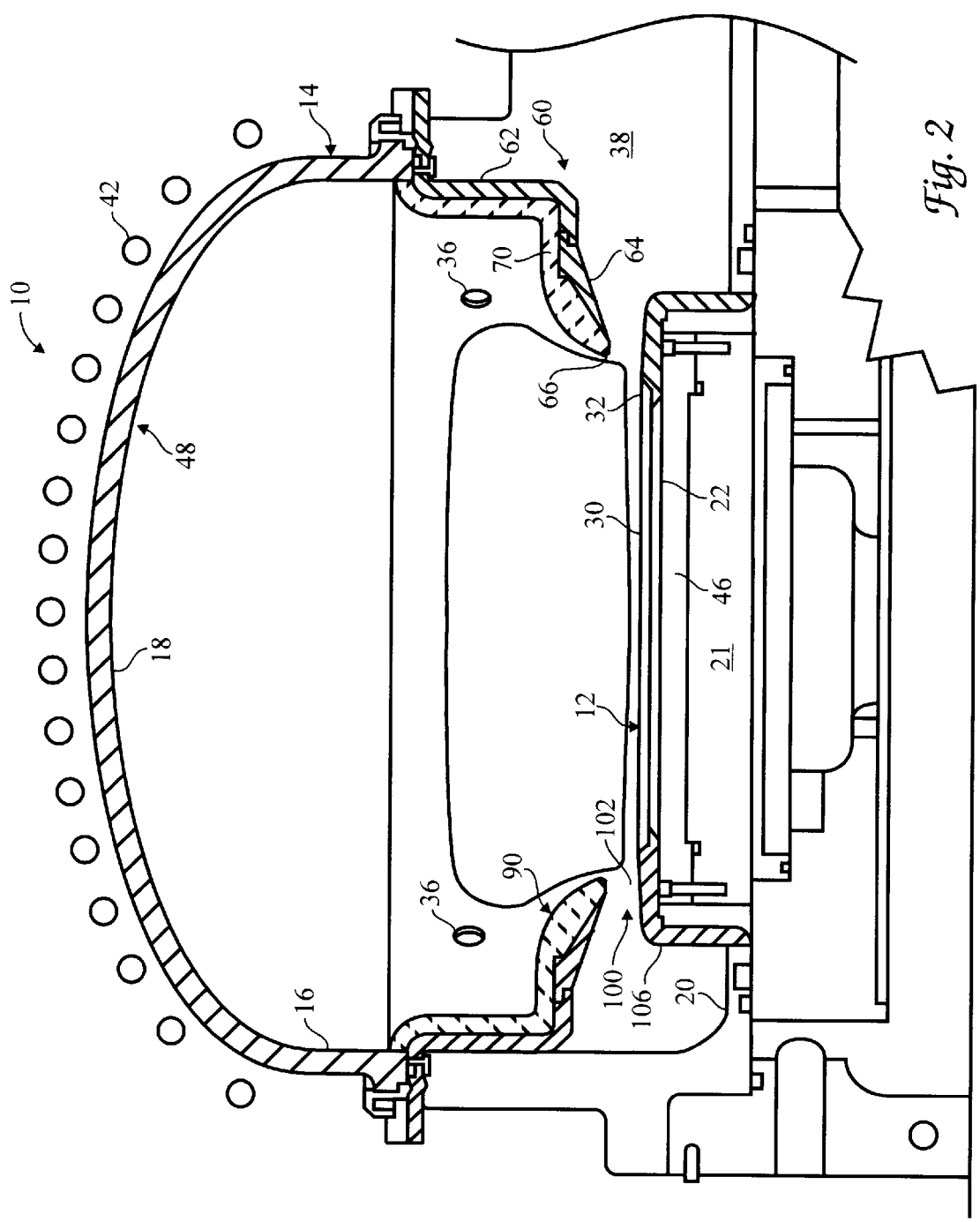
FIG. 2 is a sectional schematic view of another embodiment of the process chamber of FIG. 1.

In a preferred embodiment, as shown in FIG. 2, the conductor member 60 comprises (i) an L-shaped member 62 screwed or bolted to the sidewalls 16 of the process chamber 14, and (ii) a conducting arm 64 removably attached to, and extending from, the L-shaped member toward the substrate 12. The conducting arm 64 preferably comprises a tapered tip having a rounded edge 66 extending continuously around the perimeter 32 of the substrate 12. The rounded edge 66 exhibits reduced erosion by impinging plasma ions in the chamber 14. Advantageously, the conducting arm 64 comprises a detachable joint, such as a buttressed, ledge/collar, or snap-fit joint that mates with the L-shaped member 62. The detachable arm 64 allows quick replacement when eroded by the corrosive plasma and/or process gas in the chamber 14. The conductor member 60 can also form an extension of the sidewalls 16 of the process chamber 14 rather than a separate structure. In this embodiment, the sidewall 16 of the chamber 14 comprises an extended ledge projecting inwardly toward the substrate 12. Preferably, the conducting arm 64 is shaped and sized to rest on the extended ledge to allow quick removable and replacement when eroded. In yet another configuration, the conductor member 60 comprises an annular collar ring that rests on the support 21, with a dielectric layer 26 interposed therebetween to prevent electrical shorting between the grounded conductor and the charged support.

A dielectric surface 70 covers the entire surface of the conductor member 60 and extends contiguously around the perimeter 32 of the substrate 12. The dielectric surface 70 can comprise a dielectric layer covering the conductor member 60, or can comprise a separate monolithic dielectric structure overlying the conductor member. The dielectric surface 70 comprises a non-conducting dielectric or low conductance material which has a dielectric constant sufficiently high to prevent shorting of the plasma through the dielectric surface to the underlying conductor, and sufficiently low to allow the conductor member 60 to electrically couple with the cathode 46 via the plasma in the chamber 14. Suitable dielectric materials comprise a resistivity ranging from about $10^{10} \Omega/cm$ to $10^{20} \Omega/cm$; a dielectric constant of at least about 3, and more preferably at least about 4; and a dielectric breakdown strength of 1 to 7 kv. Preferred dielectric materials include ceramics, for example alumina, silicon carbide, silicon nitride, titanium oxide and equivalents and mixtures thereof.

In a preferred embodiment, the dielectric surface 70 includes a plurality of electrical ground pathways 80 extending therethrough. The electrical ground pathways 80 are spaced apart and electrically isolated from one another by portions of the dielectric surface 70. In one version, the dielectric surface 70 comprises a unitary and continuous surface having a plurality of individually isolated electrical ground pathways 80 therethrough, that allow the charge or electrons from impinging plasma species to flow to ground through the pathways. Plasma ions are attracted to the conductive ground pathways 80 due to the potential difference between exposed portions of the grounded pathways and the plasma ions. The electrical ground pathways 80 are electrically isolated from one another so that each electrical pathway forms a separately controllable leakage path to ground. The physical and electrical properties of the ground pathways 80 are selected to regulate the quantity of charge flowing from the plasma to ground to provide a predefined leakage current to ground. The strength and distribution of electric field lines between the cathode 46 and the ground pathways 80 is inversely proportional to the flow of charge from the plasma ions through the ground pathways. Therefore, controlling the flow of charge from the plasma ions through the ground pathways 80 provides control of the electric field between the cathode 46 and the anode 48. The amount of leakage current also determines the rate of discharge of the plasma ions through the ground pathways 80 to control the equilibrium of plasma levels or densities in the chamber 14. A higher leakage current provides a higher discharge rate and a lower steady state or equilibrium plasma level. Preferably, the grounded pathways provide a leakage current of from about 5 microamps to about 1000 microamps, more preferably it is from 20 microamps to 500 microamps, and most preferably it is from 50 microamps to 100 microamps. The number and distribution of grounded pathways 80 is selected to provide a leakage current that maintains a predefined discharge rate for the charge carried by the plasma ions. Preferably, the dielectric surface 70 includes at least about 10 electrically conducting paths to ground per square centimeter of dielectric surface, and more preferably, from about 10 to about 1000 electrically conducting ground paths/cm² of dielectric surface area.

In one function, the ground pathways 80 serve to increase the effective area of the anode 48 by providing grounded surfaces having a predefined exposed grounded surface area immediately adjacent to and abutting the substrate 12. As explained above, the increased surface area ratio of the anode to cathode surfaces increases the total amount of plasma ions generated in the chamber 14 and renders the plasma ion distribution more uniform. The ground pathways 80 are positioned substantially uniformly spaced apart along the perimeter 32 of the substrate 12 to form an extension of the anode 48 that allows the electric field in the chamber 14 to be uniformly distributed along the surface 30 and perimeter of the substrate. Preferably, the ground pathways 80 are positioned spaced apart by about 0.1 mm to about 100 mm, and are arranged continuously along the perimeter 32 of the substrate 12, so that the electric field lines are formed substantially uniformly along the entire perimeter of the substrate.

The ground pathways 80 also serve to provide a controlled leakage pathway for discharging plasma ions to ground to allow fast dechucking of the substrate 12 electrostatically held to the chuck 22. During processing, the plasma ions form a thin sheath above the substrate surface 30. To dechuck the substrate 12, the attractive force between the substrate and the electrostatic member 23 of the chuck 22 must be eliminated. After processing of the substrate 12, the supply of voltage to the electrostatic member 23 is turned off to disperse the accumulated electrostatic charge on the electrostatic member. However, the charge carried by plasma ions in the plasma sheath continue to accumulate on the substrate 12, causing the substrate to remain electrostatically attracted to the chuck 22 even after power to the chuck is turned off, and often even when the substrate is electrically grounded. The electrical ground pathways 80 around the perimeter 32 of the substrate 12 provide paths to ground for the charge carried by the plasma ions in the plasma sheath thereby preventing accumulation of residual charge from the plasma ions in the substrate during the dechucking step. The reduced residual electrostatic attraction between the substrate 12 and the chuck 22 allows the substrate to be removed from the chuck without damage from the opposing mechanical forces of the residual electrostatic attraction and the substrate removal apparatus. Further, the substrate 12 can be removed within the time allocated for the dechucking step to maintain processing efficiency and throughput.

Figure 3:
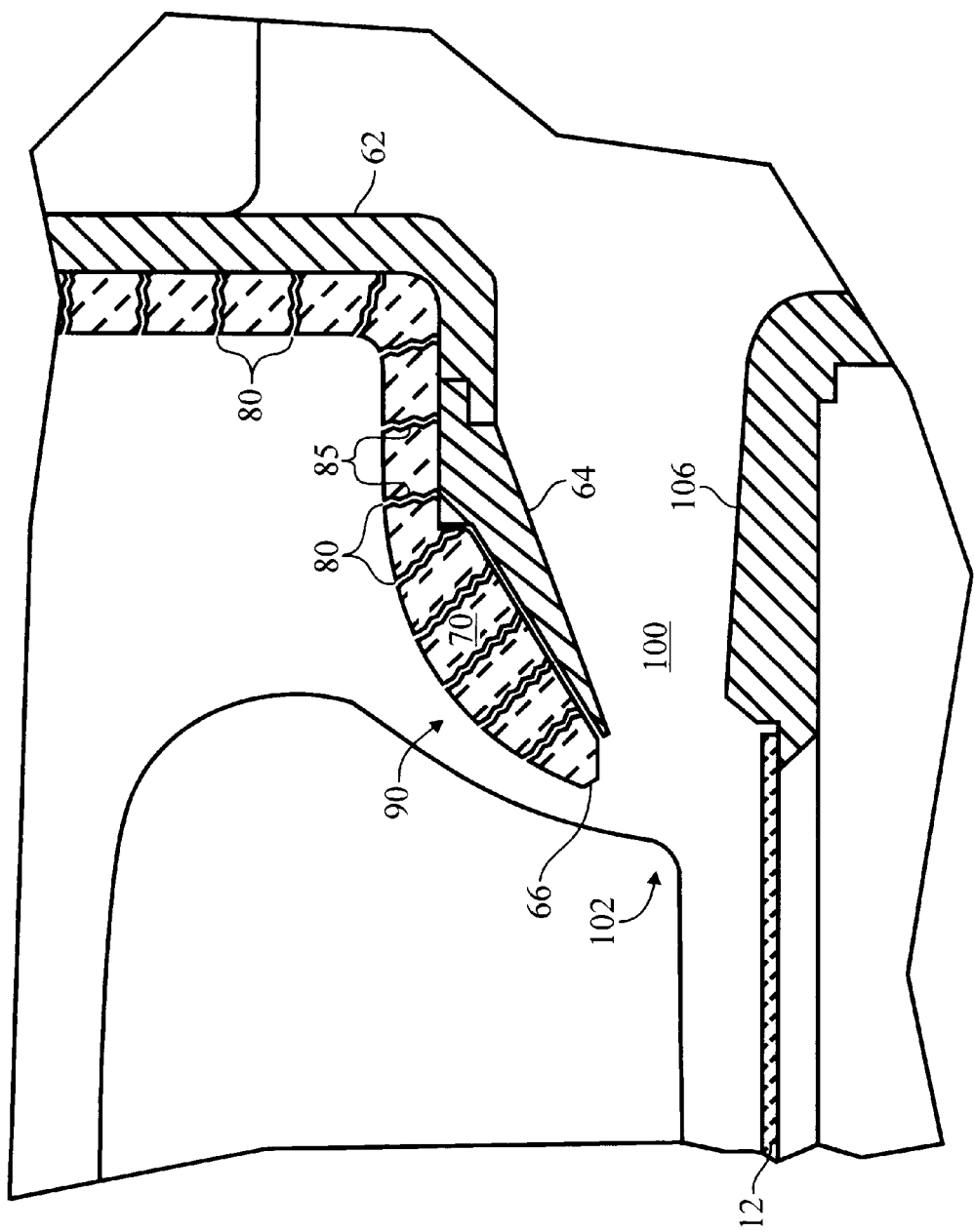
FIG. 3 is a detailed view of the focus ring shown in the process chamber of FIG. 2.

In one embodiment, the ground pathways 80 are formed by microcracks 85 in the dielectric surface 70. The microcracks have openings that expose portions of the underlying conductor member 60, as shown in FIG. 3. The microcracks 85 allow the charge carried by the plasma ions to reach the exposed portions of the conductor member 60 to flow to electrical ground. The flow of charge, or leakage current, through the ground pathways 80, is dependent upon the microcrack opening area. The larger the microcrack opening area the higher the leakage current through the ground pathway. The leakage current also depends on the surface and internal structure of the microcracks 85. More tortuous and convoluted microcracks 85 increase the effective resistivity of the grounded pathway, and a more direct and straight walled microcrack reduces the resistivity. Preferably, the opening area and electrical properties of the microcracks are selected to provide a resistance of about $2\Omega$ to about $1000\Omega$, and more preferably from $10\Omega$ to $500\Omega$, and most preferably from 20to $50\Omega$. Preferably, the total or combined opening area of all the microcracks comprises less than 5% of the total area of the dielectric surface 70. Preferably, the average width of the microcracks 85 is from about 0.5 to about 100 microns, and more preferably from 1 to 10 microns, and most preferably from 3 to 5 microns.

Figure 7:
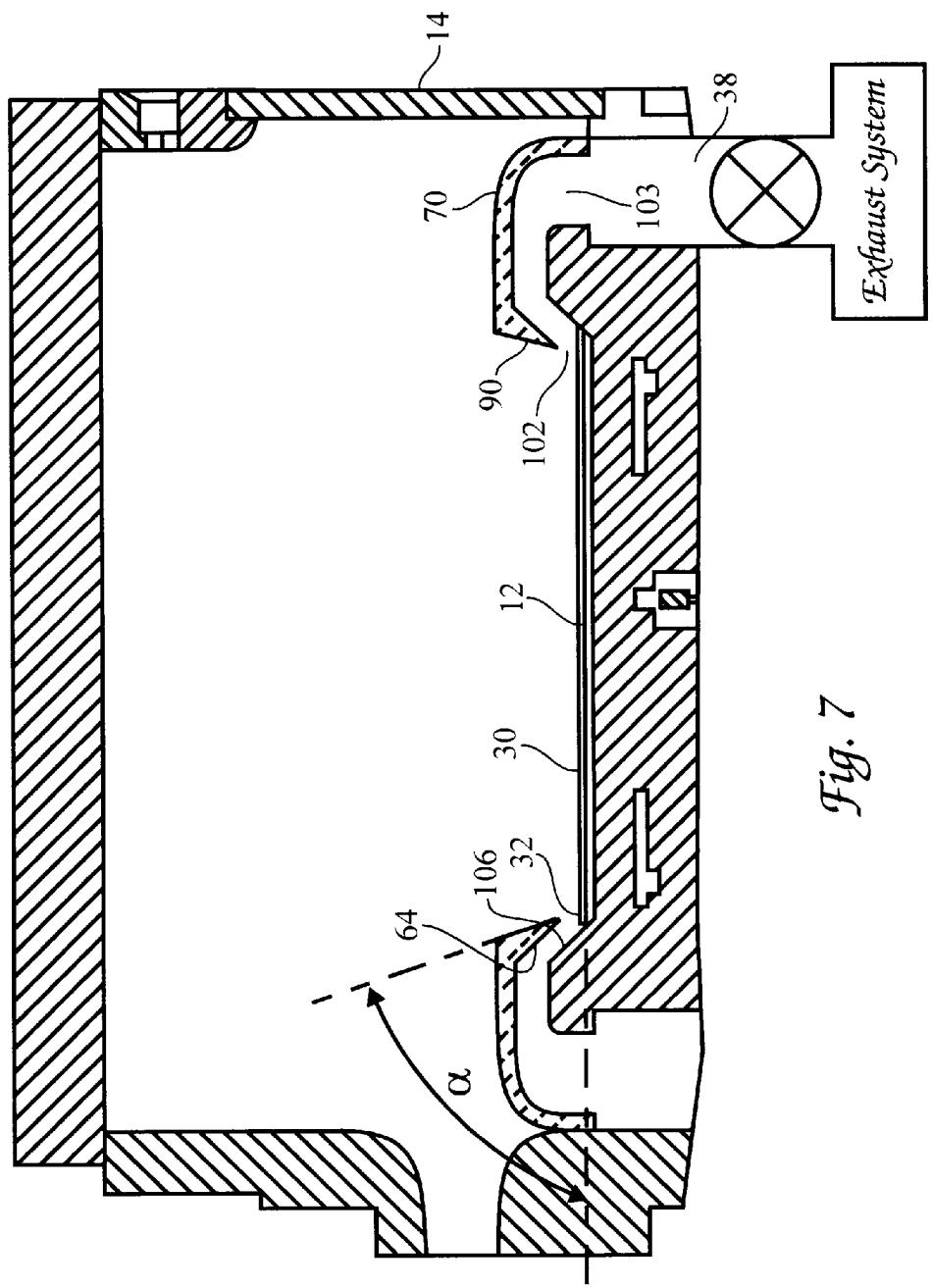
FIG. 7 is a sectional schematic view of another version of a process chamber according to the present invention showing a focus ring with an open-ended channel therein.

Another aspect of the present invention comprises a focus ring 90 for directing the flow of process gas 110 and/or plasma onto the surface 30 of the substrate 12 to provide a uniform distribution of reactive process gas species across the substrate surface 30, and to remove process gas byproduct from the plasma processing zone above the substrate. Referring to FIG. 7, the dielectric surface 70 comprises a focus ring 90 having a focusing wall or surface extending upwardly in a plane transverse to the substrate surface 30. The wall is of a sufficient height to direct the process gas or plasma ions towards the surface of the substrate 30. The height of the focus ring 90 is selected depending upon the process conditions in the process chamber 14, a suitable height for 6 to 12 inch diameter substrates being about 15 mm to about 25 mm. Preferably, the plasma focus ring 90 is sloped at an angle α of from about 45° to about 75° from the plane of the substrate surface 30 to form an inverted conical surface that directs plasma species toward the substrate 12 substantially without interfering with or blocking transport of the process gas. Preferably, the plasma focusing wall comprises a focusing surface that extends substantially continuously about the entire perimeter of the substrate 12 at an angle α of about 60° to the plane of the substrate surface 30.

In a prefered embodiment, the focus ring 90 further comprises an open-ended annular channel 100 having an inlet adjacent to and extending substantially continuously around the peripheral edge of the substrate 32. Conventional focus rings cause stagnation of the process gas at the bottom wall of the ring next to the peripheral edge of the substrate 32 resulting in the deposition of process gas byproducts on the focus ring 90 and on the walls of the process chamber 14 facing the substrate 12. These deposits can flake off and produce particulates that contaminate the substrate 12 and processing components, during processing or manipulation of the substrate in the process chamber 14. The open-ended channel 100 enhances the uniformity and the distribution of reactive process gas across the substrate surface by removing such stagnant process gas, and consequently reducing formation and deposition of contaminant particles on the substrate surface 32. Preferably, as shown in FIG. 7, the open-ended channel 100 comprises a gas flow pathway having an inlet 102 extending substantially continuously around the peripheral edge of the substrate surface 30, and an outlet 103 directed toward and leading to the exhaust port 38 in the chamber 14.

Figure 4:
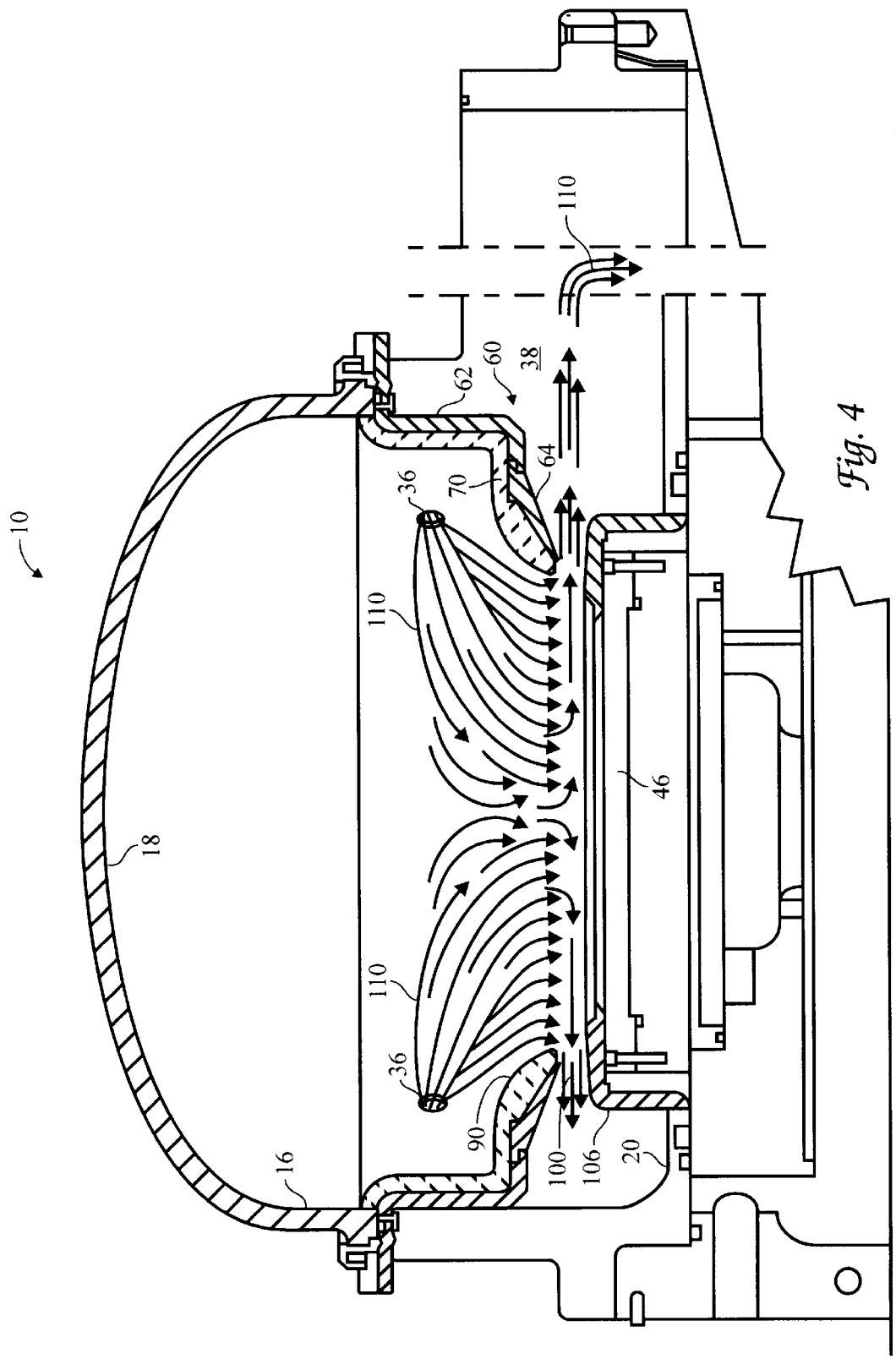
FIG. 4 is a sectional schematic view of another embodiment of the process chamber according to the present invention.
Figure 5:
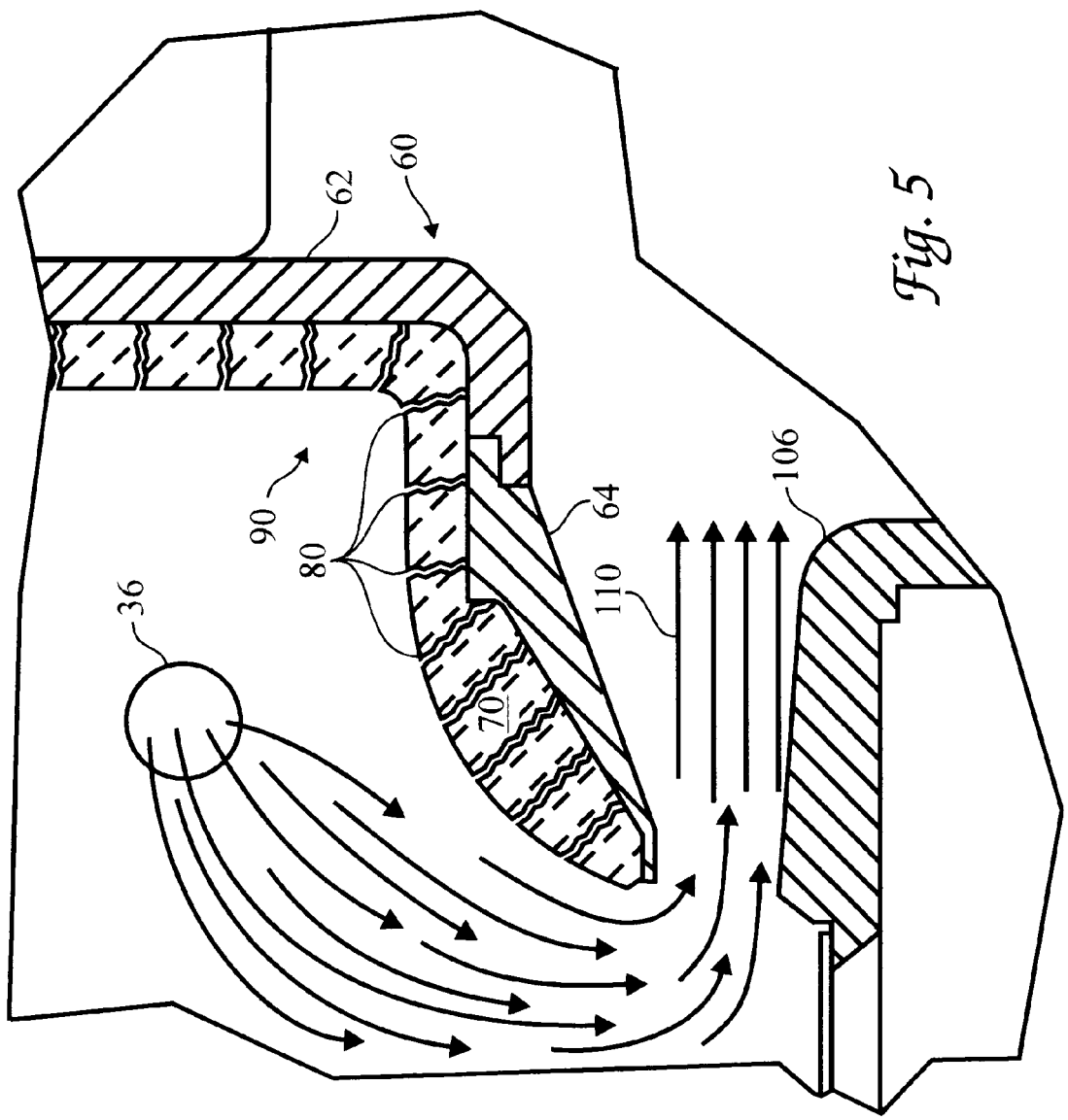
FIG. 5 is a detailed sectional schematic view of the focus ring shown in the process chamber of FIG. 4 illustrating process gas flow through the channel in the focus ring.

In one version, the channel 100 is substantially in the same plane as the surface 30 of the substrate 12 to maintain a substantially laminar flow of process gas across the entire surface of the substrate 12. Referring to FIGS. 4 and 5, an upper surface of a collar 106 and the under surface of the conductor member 60 define the channel 100 in the process chamber 14. The under surface of the conducting member 60 and the upper surface of the collar 106 are arranged so that the axial center plane of the channel 100 is substantially in the same plane as the surface of the substrate 12. This configuration allows spent process gas and byproducts to flow directly outward from the substrate surface 30 as shown by the arrow 110 without being blocked by an obstructing surface. As a result, the formation and deposition of process gas byproducts on the substrate, and particularly at the peripheral edge of the substrate, is significantly reduced.

Figure 6:
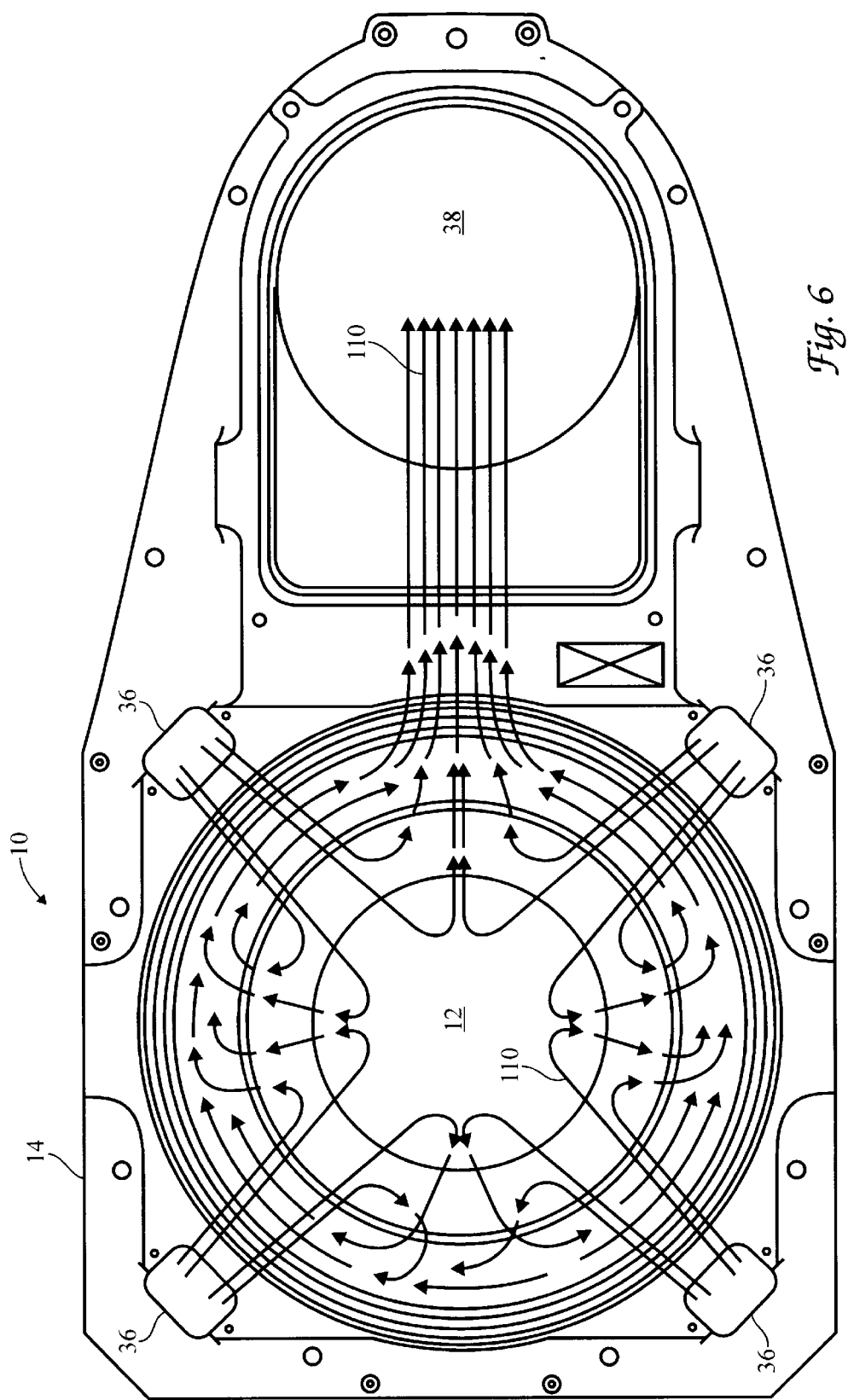
FIG. 6 is a top schematic view of a partial section of the process chamber of FIG. 4 illustrating process gas flow in the chamber.

FIG. 6 shows a top perspective view of the process chamber 14 to illustrate the flow of process gas 110 in the process chamber 14, and removal of process gas byproducts through the channel 100 and into the exhaust system 38. A turbo pump can be utilized to quickly and efficiently remove the process gas via the exhaust port(s) 38. Fresh process gas enters the process chamber 14 via the gas nozzles 36. Thereafter, the focus ring 90 directs the process gas and plasma to the surface 30 of the substrate 12 so that the entire surface of the substrate is uniformly processed. Spent process gas containing undesirable byproducts flows out along the perimeter 32 of the substrate 12 and into the inlet 102. Thus, the process gas is directed to the surface 30 of the substrate 12 in a substantially symmetrical fashion, and spent process gas and byproducts are removed from the process chamber 14 via the inlet 102.

Figure 8:
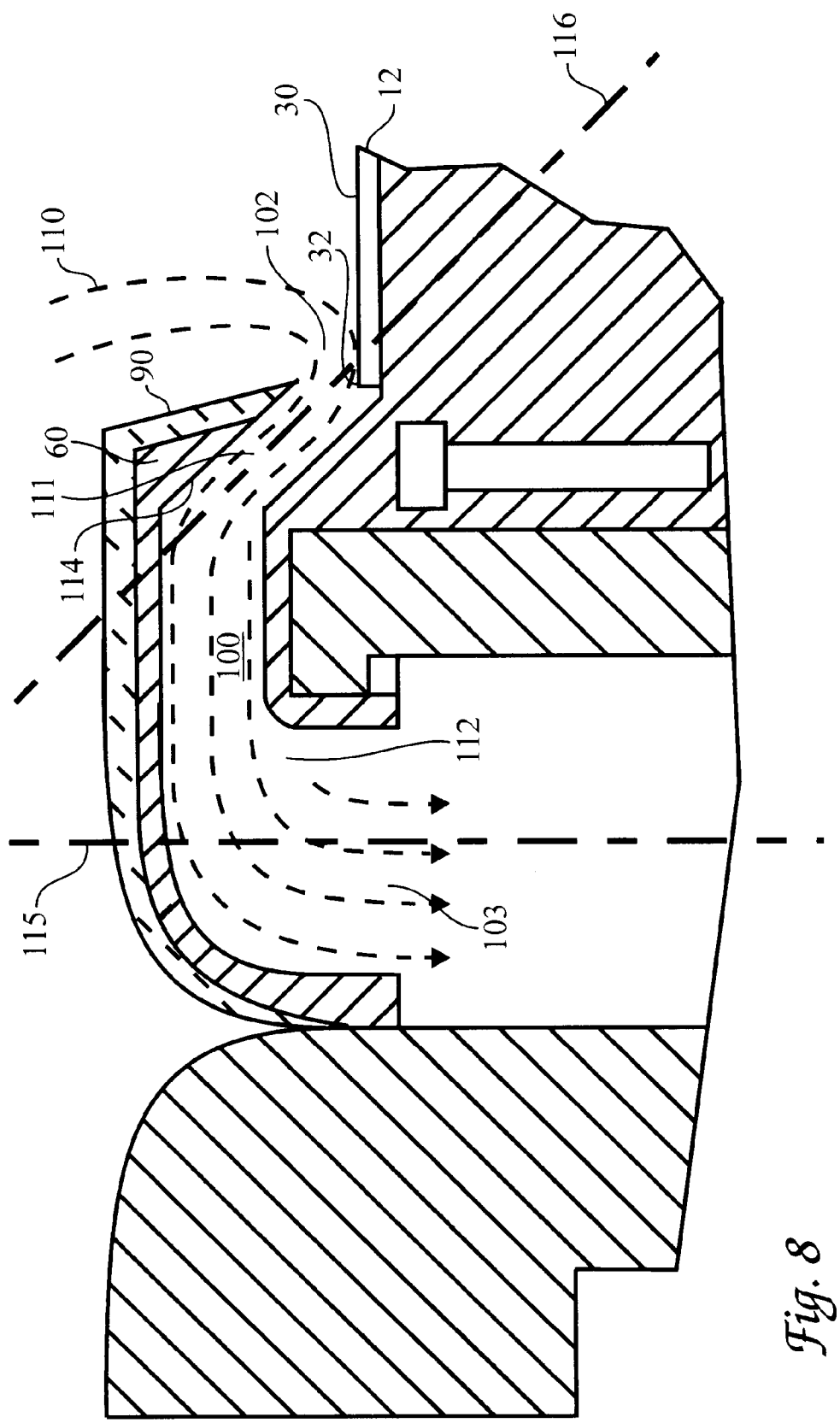
FIG. 8 is a detailed schematic view of the focus ring shown in FIG. 7 showing process gas flow through the inlet and outlet of the channel.

In another version, illustrated in FIGS. 7 and 8, the inlet 102 of the channel 100 comprises an inlet 102 having an axial central axis 116 that is at an angle to the plane of the surface of the substrate 30, whereas at least a portion of the outlet 103 of the channel 100 comprises an opening having an axial central axis 115 substantially aligned to the central axis of the exhaust port 38. In the embodiment illustrated in FIG. 8, the channel 100 is defined by a gap between an overhang 60 that is spaced apart from a raised collar 106 surrounding the peripheral edge of the substrate 32. The overhang 60 comprises an inner conical surface 90 that tapers toward the peripheral edge of the substrate 32 to focus a plasma on the substrate 12, and an outer conical surface 114 that tapers away from the peripheral edge of the substrate 32 to direct spent process gas away from the substrate surface 30. In a preferred version the overhang 60 comprises an inwardly extending lip having a lower surface conforming to the shape of an upper surface of the raised collar 106 to provide the desired cross-sectional geometery of the channel.

In yet another version the channel 100 comprises an inlet 102 having an opening sized smaller than an opening of the outlet 103. Preferably the cross-sectional area of the channel 100 increases continuously from the inlet 102 to the outlet 103. Thus, the channel 100 comprises a pathway with a narrow gas flow constricting portion 111 adjacent to the substrate, and a wide gas flow enhancing portion 112 adjacent to the exhaust system port 38. This causes the gas flow to accelerate as it passes through the channel to effectively remove process gas byproducts from the peripheral edge of the substrate. Preferably, the opening of the inlet 102 is sized from about 0.5 to about 100 mm, and more preferably from 5 to 10 mm; and the opening of the outlet 103 is sized from about 10 to about 100 mm, and more preferably from 25 to 40 mm.

To process a substrate 12, the process chamber 14 is evacuated and maintained at a predetermined subatmospheric pressure. The substrate 12 is then deposited on the chuck 22 using a robotic arm and lift pin mechanism. The electrostatic member 23 is electrically biased with respect to the substrate 12 by an electrical voltage. Process gas is introduced into the process chamber 14, and a plasma is formed from the process gas by maintaining an inductive field in the chamber using coils 42 and by electrically biasing the process electrodes 46, 48, as described above. The plasma is attracted to the substrate 12 by the electric field between the anode electrode 46 and cathode electrodes 48. The plasma in the chamber 14 provides electrically charged species having opposing polarity which accumulate in the substrate 12 to provide an attractive electrostatic force that electrostatically holds the substrate to the chuck 22.

The focus ring 90 focuses the plasma and reactive process gas on the substrate surface. Not only is the process gas directed to the surface 30 of the substrate 12 in a substantially symmetrical fashion, but spent process gas and byproducts are also removed from the process chamber 14 via the outlet 102 underneath the non-conducting wall. This minimizes exposure of the chamber walls to the process byproducts. Further, as shown in FIG. 6, the process gas is directed towards the surface 30 and perimeter 32 of the substrate 12 such that the entire surface of the substrate is uniformly processed.

Preferably the focus ring comprises a plurality of ground pathways 80 which are uniformly spaced apart and extend contiguous to, and continuously along, the perimeter 32 of the substrate 12 to provide electrical paths to ground for the charged ions and species in the plasma. The ground pathways 80 extend through a dielectric surface 70 abutting and extending substantially continuously around the perimeter 32 of the substrate 12 to effectively increase the surface area of the anode 48 and provide a higher anode to cathode surface area ratio in the process chamber 14. The resultant electric field occupies a large volume in the process chamber 14 and provides higher plasma ion levels that uniformly span across the substrate surface. The extended anode surface area also provides sufficient plasma ions to securely chuck the substrate 12 to the chuck 22. Furthermore, the ground pathways 80 allow rapid discharging of plasma ions to ground to provide fast dechucking of the electrostatic substrate 12.

The apparatus described herein can be used to deposit material on a substrate such as by chemical vapor deposition, etch material from the substrate, or clean contaminant deposits deposited on chamber sidewalls and processing components. Chemical vapor deposition processes that can be performed in the apparatus to deposit coatings on the substrate, are generally described in Chapter 9, VLSI Technology, 2nd Ed., Ed. by Sze, McGraw-Hill Publishing Co., New York, which is incorporated herein by this reference. Typical chemical vapor deposition processes for depositing $SiO_2$ on a substrate use process gases such as (i) silicon source gas for example $SiH_4$ or $SiCl_2H_2$, and an oxygen source gas such as $CO_2$ and $H_2O$, or $N_2O$; or (ii) a single gas containing both silicon and oxygen such as $Si(OC_2H_5)_4$. CVD processes for depositing $Si_3N_4$ typically use gases such as $SiH_4$ and $NH_3$ or $N_2$. Other conventional CVD process gases include $NH_3$, $AsH_3$, $B_2H_6$, KCl, $PH_3$, $WF_6$, and $SiH_4$. The apparatus can also be used for plasma etching processes as generally described in *VLSI Technology, Second Edition,* Chapter 5, by S. M. Sze, McGraw-Hill Publishing Company (1988), which is incorporated herein by reference. Typical metal interconnect etching processes use process gases such as $BCl_3$, $Cl_2$, $SF_6$, $CF_4$, $CFCl_3$, $CF_2Cl_2$, $CF_3Cl$, $CHF_3$ and $C_2ClF_5$. Resist etching processes typically use oxygen gas to etch the polymeric resist on the substrate.

Although the present invention has been described in considerable detail with regard to the preferred versions thereof, other versions are possible. In particular, other configurations of electrical ground pathways are possible, for example, configurations in which each ground pathway forms a separate structure having an exposed terminal in the chamber. Therefore, the appended claims should not be limited to the descriptions of the preferred versions contained herein.

What is claimed is:

1. A process chamber for processing a substrate having a surface with a perimeter, the process chamber comprising:
    (a) a support for supporting the substrate;
    (b) a gas distributor for distributing process gas into the process chamber;
    (c) a plasma generator for forming plasma comprising charged plasma species from the process gas; and
    (d) a plurality of electrical ground pathways around the perimeter of the substrate, the ground pathways spaced apart and electrically isolated from one another, thereby providing paths to electrical ground for the charged plasma species.

2. The process chamber of claim 1 wherein the ground pathways have at least one of the following characteristics:
    (i) a resistivity from about 2Ω to about 1000Ω; or
    (ii) a controlled current leakage path of about 5 to about 1000 microamps.

3. The process chamber of claim 1 wherein the ground pathways are through a dielectric surface abutting and extending substantially continuously around the perimeter of the substrate.

4. The process chamber of claim 3 wherein the dielectric surface comprises at least about 10 ground pathways/$cm^2$.

5. The process chamber of claim 3 wherein the ground pathways comprise microcracks extending through the dielectric surface to expose portions of a conductor member abutting the dielectric surface.

6. The process chamber of claim 5 wherein the microcracks comprise at least one of the following characteristics:
    (i) the microcracks have openings with a total area of less than about 5% of a total dielectric surface area;
    (ii) the microcracks have openings with an average width of about 0.5 microns to about 100 microns.

7. The process chamber of claim 5 wherein the conductor member comprises:
    (i) an L-shaped conductor extending from walls of the process chamber toward the substrate; or
    (ii) an annular collar resting on the support for the substrate.

8. The process chamber of claim 3 wherein at least a portion of the dielectric surface comprises a plasma focusing surface extending upwardly in a plane transverse to the surface of the substrate to direct the plasma species towards the substrate.

9. The process chamber of claim 3 wherein the dielectric surface comprises at least one of the following characteristics:
    (1) a dielectric constant of from about 2 to about 4; or
    (2) a dielectric breakdown strength of from about 1 kV to about 7 kV.

10. The process chamber of claim 1 further comprising an electrostatic chuck for electrostatically holding the substrate in the process chamber, and wherein the ground pathways are distributed around the periphery of the chuck such that electrical charge of the charged plasma species above the electrostatic chuck can be rapidly dissipated through the ground pathways.

11. The process chamber of claim 1 further comprising an open-ended channel having (i) an inlet adjacent to, and extending substantially continuously around, a peripheral edge of the substrate; and (ii) an outlet directed substantially toward an exhaust port in the chamber.

12. A composite focus ring for processing a substrate in a plasma, the composite focus ring comprising:
    (a) a conductor member shaped and sized to abut, and extend substantially continuously around, a perimeter of the substrate; and
    (b) a dielectric on the conductor member, the dielectric having a plurality of electrical ground pathways extending therethrough, the ground pathways capable of discharging charge carried by plasma species used to process the substrate.

13. The composite focus ring of claim 12 wherein the ground pathways comprise at least one of the following characteristics:
    (1) the ground pathways are spaced apart and electrically isolated from one another by the dielectric surface;
    (2) the ground pathways comprise a resistivity from about 2Ω to about 1000Ω; or
    (3) the ground pathways comprise a controlled current electrical leakage path of from about 5 to about 1000 microamps.

14. The composite focus ring of claim 12 wherein the dielectric comprises at least about 10 ground pathways/cm² of dielectric surface area.

15. The composite focus ring of claim 12 wherein the ground pathways comprise microcracks extending through the dielectric to expose portions of the conductor member abutting the dielectric.

16. The composite focus ring of claim 15 wherein the microcracks comprise at least one of the following characteristics:

(i) openings having a total opening area of less than about 5% of the total dielectric surface area;

(ii) openings having an average width of about 0.5 microns to about 100 microns.

17. The composite focus ring of claim 15 wherein the conductor member comprises:

(1) an L-shaped conductor extending from walls of the process chamber toward the substrate; or (2) an annular collar resting on a support for the substrate.

18. The composite focus ring of claim 15 wherein at least a portion of the dielectric surface comprises a plasma focusing surface extending upwardly in a plane transverse to the surface of the substrate to direct plasma species towards the substrate.

19. The composite focus ring of claim 15 wherein the dielectric surface comprises at least one of the following characteristics:

(1) a dielectric constant of from about 2 to about 4; or (2) a dielectric breakdown strength of from about 1 kV to about 7 kV.

20. A method of processing a substrate in a plasma zone, the method comprising the steps of:

(a) placing the substrate in the plasma zone, the substrate having a surface with a perimeter;

(b) introducing process gas into the plasma zone and forming charged plasma species from the process gas; and (c) providing a plurality of electrical ground pathways around the perimeter of the substrate to provide paths to electrical ground for the charged plasma species, the ground pathways spaced apart and electrically isolated from one another.

21. The method of claim 20 wherein the plasma zone comprises anode and cathode electrodes for forming a capacitively coupled electric field in the plasma zone, and wherein step (c) comprises the step of maintaining a sufficient number of ground pathways around the perimeter of the substrate to provide a surface area ratio of the anode to cathode electrode of at least about 1.5:1.

22. The method of claim 20 wherein in step (c) the ground pathways provide:

(1) a resistivity from about 2Ω to about 1000Ω; or (2) a controlled current electrical leakage path of about 5 to about 1000 microamps.

23. The method of claim 20 wherein step (b) further comprises the step of directing the charged plasma species onto the surface of the substrate using a plasma focusing surface.

24. The method of claim 20 further comprising the step of removing the process gas byproduct from the plasma zone by directing the flow of process gas byproduct into an inlet of an open-ended channel adjacent to the substrate.

25. A process chamber for processing a substrate having a surface with a center and a peripheral edge, the process chamber comprising:

(a) a support for supporting a substrate;

(b) a gas distributor for distributing process gas in the chamber, and an exhaust port for removing spent process gas from the chamber;

(c) a plasma generator for forming a plasma from the process gas; and (d) a focus ring comprising a wall surrounding the substrate to direct the plasma toward the substrate surface, the wall having an open ended channel comprising an inlet adjacent to, and extending substantially continuously around, the peripheral edge of the substrate, and an outlet directed substantially towards the exhaust port in the chamber.

26. The apparatus of claim 25, wherein the channel comprises an inlet having an opening sized smaller than an opening of the outlet.

27. The apparatus of claim 25, wherein the cross-sectional area of the channel increases from the inlet to the outlet.

28. The apparatus of claim 25, wherein the inlet and outlet of the channel each comprise an axial central axis substantially in a same plane as the substrate.

29. The apparatus of claim 25, wherein the inlet of the channel comprises an opening having an axial central axis that is at an angle to a plane of the surface of the substrate.

30. The apparatus of claim 29, wherein at least a portion of the outlet of the channel comprises an opening having an axial central axis substantially aligned to an axial central axis of the exhaust port.

31. The apparatus of claim 25, wherein the channel is defined by a gap between an overhang that is spaced apart from a raised collar surrounding the peripheral edge of the substrate.

32. The apparatus of claim 31, wherein the overhang comprises an inner conical surface that tapers toward the peripheral edge of the substrate to focus a plasma on the substrate, and an outer conical surface that tapers away from the peripheral edge of the substrate to direct spent process gas away from the substrate surface.

33. The apparatus of claim 31, wherein the overhang comprises an inwardly extending lip having a lower surface conforming to a shape of an upper surface of the raised collar.

* * * * *